United States Patent [19]

[11] 3,891,441

Tsuji et al.

[45] June 24, 1975

[54] LIGHT-SENSITIVE STENCIL PRINTING MATERIAL WITH POROUS SUPPORT AND COVER SHEETS

[75] Inventors: Nobuo Tsuji; Eiichi Hasegawa, both of Kanagawa, Japan

[73] Assignee: Fuji Photo Film Co., Ltd., Minami Ashigara-shi, Japan

[22] Filed: Jan. 22, 1973

[21] Appl. No.: 325,780

Related U.S. Application Data

[63] Continuation of Ser. No. 60,233, Aug. 3, 1970, abandoned.

[30] Foreign Application Priority Data

Aug. 1, 1969 Japan ................................ 44-60807

[52] U.S. Cl. ................. 96/68; 96/35.1 UX; 96/364; 96/83; 96/85; 96/115 P UX; 101/128.3

[51] Int. Cl. ....... G03c 1/76; G03c 3/00; G03c 5/00; G03c 1/90; G03c 1/86; G03c 1/68

[58] Field of Search ....... 96/85, 35.1, 83, 68, 115 P, 96/36.4; 101/128.3

[56] References Cited

UNITED STATES PATENTS

| | | | |
|---|---|---|---|
| 2,969,731 | 1/1961 | Kendall | 101/128.3 |
| 3,060,026 | 10/1962 | Heiart | 96/85 |
| 3,097,096 | 7/1963 | Oster | 96/85 |
| 3,198,633 | 8/1965 | Cohen et al. | 96/28 |
| 3,353,955 | 11/1967 | Colgrove | 96/35.1 |
| 3,408,191 | 10/1968 | Jeffers | 96/35.1 |
| 3,770,438 | 11/1973 | Celeste | 96/115 P |

*Primary Examiner*—Ronald H. Smith
*Assistant Examiner*—Richard L. Schilling
*Attorney, Agent, or Firm*—Sughrue, Rothwell, Mion, Zinn and Macpeak

[57] ABSTRACT

A light-sensitive stencil printing material comprising a porous support having impregnated therein a photopolymerizable composition containing a liquid photopolymerizable monomer and a photopolymerization initiator, and cover films provided on both sides of said support.

18 Claims, 3 Drawing Figures

INVENTORS
NOBUO TSUJI
EIICHI HASEGAWA

BY Sughrue, Rothwell, Mion, Zinn & Macpeak
ATTORNEYS

LIGHT-SENSITIVE STENCIL PRINTING MATERIAL WITH POROUS SUPPORT AND COVER SHEETS

This is a continuation of application Ser. No. 60,233, filed Aug. 3, 1970.

BACKGROUND OF THE INVENTION

1. Field of the Invention

The present invention relates to a light-sensitive stencil printing material and more particularly to a light-sensitive stencil printing material capable of making a stencil master for mimeographic printing.

2. Description of the Prior Art

A method for the production of a stencil printing material is described in Japanese Pat. No. 413,255. According to this method, a light-sensitive stencil printing material is employed which comprises a light-sensitive material sandwiched between a cover film and a backing support, wherein the adhesion property of the light-sensitive material to the cover film is larger than that to the backing support without exposure, but is smaller than that to the backing support upon photo-exposure. In parctical use, it is contacted with an original and then the cover film is stripped from the backing support after exposure, whereby the exposed portion of the light-sensitive layer is transferred to the cover film and thus a stencil pattern is obtained. In this method, there are used various kinds of adhesion-endowing agents, such as water, toluene, acetone, glycerin, polyethylene glycol, ethylene glycol, dimethyl phthalate, tricyesyl phosphate, dibutyl phthalate, polyvinyl butyral, polyvinyl acetate, polyvinyl pyrrolidone, cumarone indene resins, phenol resins, rubber, gelatin, silicone resins and the like. As the light-sensitive material, there are used, for example, monomers such as acrylamide, vinyl acetate and the like; dyes such as rose bengal, acriflavine and the like; reducing agents such as thiourea, ascorbic acid, ethylene diamine tetraacetate and the like.

However, a practically good pattern could not always be obtained and this fact was confirmed by the present inventors' experiments, according to the examples of that method. The reason is seemingly based on the use of the adhesion-endowing agent, except the light-sensitive material. That is, since the adhesion-endowing agent is impregnated into the porous backing support, an unexposed portion of the light-sensitive material, when the cover film is stripped from the porous support after exposure, is not completely adhered to the cover film and therefore large portions remain on the porous backing support.

Therefore, it has been very difficult to produce a stencil printing master capable of forming clear images from a light-sensitive stencil printing material. Accordingly, complicated operations such as cleaning the residual light-sensitive composition in the unexposed portions or removing the same with a solvent must be conducted.

An object of the present invention is to provide a stencil printing material capable of producing a useful and practical stencil master by exposure.

Another object of the present invention is to provide a stencil printing material capable of forming very clear images by using only a stripping operation of a cover film.

SUMMARY OF THE INVENTION

The present inventors have discovered that the aforesaid problems are based on the physical properties of the light-sensitive composition, especially its rheology, and have found that the above purposes can be effectively achieved by giving a thixotropic property to the light-sensitive composition; that is, a property such that the viscosity of the light-sensitive composition is high in a state of stillness but which becomes low when subjected to force; for example, in the case of stripping the cover film from the backing support.

The light-sensitive stencil printing material of the present invention is composed of (1) a porous backing support impregnated with a photopolymerizable composition comprising a photopolymerizable liquid monomer and a photopolymerizing initiator, and (2) cover films provided on both sides of the support.

DETAILED DESCRIPTION OF THE PREFERRED EMBODIMENTS

One feature of the present invention lies in the use of a liquid monomer or an oligomer as the light-sensitive polymerizable component. Since a solid monomer or polymer is used in a number of examples described in the above patent specification, water or an organic solvent must be used in order to reduce the viscosity thereof, and the solvent must preferably be selected from those having a boiling point as low as possible to evaporate off the solvent shortly after exposure and strip off the material. Further, the low boiling point solvent evaporates gradually during storage thereof, and so it is impossible to preserve it stably for a long period of time.

On the contrary, since a high boiling point liquid monomer which becomes solid by exposure is used in the stencil printing material of the present invention, the material is durable for a long period of time, and other solvents are unnecessary, and therefore, the material is suitable for the above objects. Further, the handling of the stencil printing material obtained by the method of the above patent is difficult in printing because it contains residual water or solvent, but the handling of the material of the present invention is much easier in printing because no residual liquid is present after exposure and therefore the material is in a dry state.

Further, the present inventors have found that better effects are obtained when finely divided powders having a particle size of from 5 millimicrons to 50 microns are added to the photopolymerizable composition. The photopolymerizable composition containing the fine powders is viscous in a state of stillness and loses the high viscosity under the application of a strong force. If a suitable combination of the polymerizable composition and the cover film is selected, unexposed portions of the polymerizable composition are easily transferred to the cover film without remaining on the porous backing support, whereby a very clear stencil master can be formed.

The stencil printing master produced from the stencil printing material of the present invention also has all of the advantages as described in the above patent. That is, neither a wetting nor a drying treatment is required in the preparation of a pattern, and development is conducted very simply and quickly as compared with the conventional wetting process.

The present invention will be illustrated in more detail by referring to the accompanying drawings.

Figure 1:
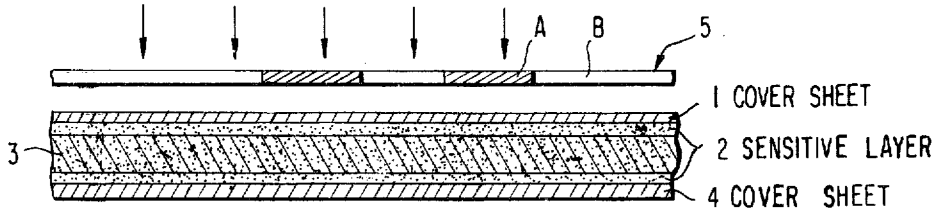
FIG. 1 represents a vertical cross-section of a light-sensitive stencil printing material and an original, prior to exposure.

FIG. 1 is a vertical cross-sectional view showing a light-sensitive stencil printing material and an original 5.

Between cover films 1 and 4, which may be the same or different substances, photopolymerizable layers 2 supported on a backing support 3 are sandwiched. At least one of the cover films 1 and 4 must transmit light in the range necessary for promoting the polymerization of photopolymerizable layers 2. The support 3 is a thin Japanese paper capable of transmitting a printing ink, such as Tenguchoshi or Gampishi, or a mesh screen of nylon or silk. The photopolymerizable composition is also impregnated into the support 3. Generally, the paper should have a thickness of 10–100 microns, preferably 20–50 microns, and a weight of 5–50g/m$^2$, preferably 10–30g/m$^2$.

Figure 2:
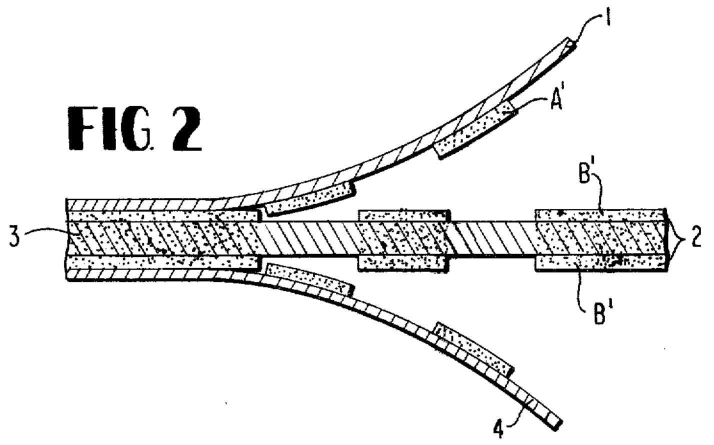
FIG. 2 represents a vertical cross-sectional view showing the stripping of the cover sheets from the material of FIG. 1, after exposure.

FIG. 2 is a vertical cross-sectional view showing the stripping of the cover films 1 and 4 from the backing support after exposure. By exposure, those portions of the photopolymerizable layers 2 corresponding to the transparent portions (B) of the original 5 are polymerized and hardened, whereby the adhesion of the photopolymerized portions to the cover films is reduced. On the other hand, those portions of the photopolymerizable layers 2 corresponding to the opaque portions (A) of the original 5 remain unexposed and unpolymerized, whereby the adhesion of the photopolymerizable layers to the cover films is maintained. Accordingly, when the cover films 1 and 4 are stripped, the exposed and polymerized portions B′ of layer 2 remain on the backing support 3 and the unexposed and unpolymerized portions A′ of layer 2 adhere to the cover films 1 and 4 and are therefore removed.

Figure 3:
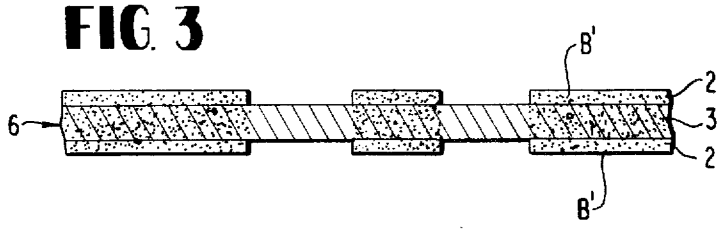
FIG. 3 represents a stencil master produced by the steps shown schematically in FIGS. 1 and 2.

Thus, there is obtained a stencil master 6 having a portion capable of transmitting a printing ink and a portion incapable of transmitting an ink, which is shown by FIG. 3.

Since the portions B′ of the master 6 are hardened by photopolymerization, they have a sufficient strength and are durable in printing.

The polymerizable liquid monomer applicable to the present invention is preferably a divinyl or polyvinyl compound, which is subjected to cross-linking by being photopolymerized. Typical examples of these monomers are compounds represented by the general formulae:

$$CH_2=\overset{R}{\overset{|}{C}}-\underset{\underset{O}{\|}}{C}O-(CH_2CH_2O)_x-\underset{\underset{O}{\|}}{C}-\overset{R_1}{\overset{|}{C}}=CH_2$$

wherein $x$ is an integer greater than 2; R and $R_1$ each represent a hydrogen atom or a methyl group, such as diethylene glycol diacrylate (or dimethacrylate), triethylene glycol diacrylate (or dimethacrylate) and the like; or $$(CH)_{y-4}-C(CH_2O\underset{\underset{O}{\|}}{C}\overset{R_2}{\overset{|}{C}}=CH_2)_y$$

wherein $y$ is an integer of from 2 to 4; $R_2$ represents a hydrogen atom or a methyl group; or $$CH_3CH_2CH_{z-3}(CH_2O\underset{\underset{O}{\|}}{C}-\overset{R_3}{\overset{|}{C}}=CH)_z$$

wherein $z$ is an integer of from 2 to 3; $R_3$ represents a hydrogen atom or a methyl group.

However, the monomer used in the present invention is not always limited to the foregoing polyvinyl compounds, but it is possible to use monovinyl compounds in addition to the other photopolymerizable liquid monomers. For example, acrylic esters (methyl, ethyl, butyl, hexyl or octyl derivatives); methacrylic esters (methyl, ethyl, butyl, hexyl or octyl derivatives); acrylamides (N-methyl acrylamide, N-ethyl acrylamide, N,N-dimethyl acrylamide, N,N-diethyl acrylamide, acryloyl morpholine and the like); methacrylamides (same derivatives as the acrylamides); vinyl esters (vinyl acetate, vinly propionate, vinyl butyrate and the like); styrenes (styrene, (1-methyl styrene and the like); vinylpyrrolidone, vinylpyridine, acrylonitrile, methacrylonitrile, vinyl imidazole and the like. α-methyl These monomers may be used singly or as mixtures with the polyvinyl type monomers, and furthermore, in some cases, in combination with a certain quantity of a solic monomer, such as acrylamide or N,N′-methylenebisacrylamide. In addition, it is permissible to use a photocross-linking type polymer together with such liquid monomers. Examples of the photocross-linking type polymers include cinnamic acid type sensitive resins (refer to Japanese Pat. No. 1492/63); furylacrylic type light-sensitive resins (see Japanese Pat. No. 17928/68); or unsaturated polyester type light-sensitive resins (see Japanese Pat. No. 19125/68) and the like (See, for example, U.S. Pat. No. 2,725,372).

The specification of Japanese Patent Publication 1492/63 is as follows:

A process for producing polyvinyl cinnamate

Detailed description of the invention

Although polyvinyl cinnamate is a highly photosensitive resin, it is difficult to produce and therefore its manufacturing cost is very high. For example, polyvinyl alcohol is swelled in the excessive amount of pyridine stirring for 24 hours at 100°C. Then cinnamic chloride is added and stirred for 4 hours in the temperature controlled bath at 50°C in the dark room, and acetone is added, to remove free PVA. Then, a large quantity of water is added to precipitate polyvinyl cinnamate. Although pyridine is expensive, it cannot be recovered because it is diluted by a large quantity of water. Acetone is also wasted. Since the reaction is performed at 100°C or 50°C stirring for a long time, much heat and electric power are consumed and still the temperature controlled bath is required and much labor is spent.

Furthermore, continuous operation cannot be performed.

In accordance with the process of this invention, all of the above difficulties are solved.

The first solution is prepared by dissolving polyvinyl alcohol in water and adding caustic soda in the solution.

The second solution is prepared by dissolving cinnamic chloride in a solvent which is immiscible with water and dissolves cinnamic chloride, such as carbon tetrachloride, methylene chloride, and chloroform.

When the two solutions are mixed and stirred, fluey polyvinyl cinnamate is formed in the boundary of the layers. Since free polyvinyl alcohol remains in the water layer and cinnamic chloride reacted with water transfers to the water layer as the sodiuum salt, only polyvinyl cinnamate is precipitated. As the condensing agent, a hydrochloric acid absorber such as caustic potash, sodium carbonate, potassum carbonate, and ammonia may be used besides caustic soda. When the solutions are allowed to stand quiet after filtering the precipitation, these solutions separate into water and the solvent, and these can be separately taken out. The reaction can be continuously performed, and it is completed in several minutes at a normal temperature. The precipitation obtained is washed with water and dried, then white photosensitive polyvinyl cinnamate is yielded. Although in the process using pyridine as the condensing agent, the product is always reddish and does not become perfectly white, the beautiful white product can be obtained in the process of this invention.

EXAMPLE

Polyvinyl alcohol was dissolved in water to make a 5 % solution, and the equal volume of a 1 N caustic soda aqueous solution was added and well stirred. Separately, cinnamic chloride was dissolved in methylene chloride to make a 5 % solution. The cinnamic chloridemethylene chloride solution was put in the reaction vessel and the polyvinyl alcohol - caustic soda solution was overlaid. Then, the white resin was immediately precipitated in the boundary of the two solutions. When the solutions were vigorously stirred for five minutes, the most part of polyvinyl alcohol was esterified and floated between the water layer and the methylene chloride layer. The precipitation was filtered, washed with water, and dried. The white resin obtained was soluble in methyl ethyl ketone, and was photosensitive, and was able to use in synthetic resin photography in the normal method.

Since the solutions after filtering were separated into two layers when these were allowed to stand quiet, methylene chloride was easily recovered by removing the water layer and distilling The specification of Japanese Patent Publication 17928/68 is as follows:

Detailed description of the invention

This invention relates to a process for highly sensitizing the furyl acrylate photosensitive resin.

The photosensitive resin of this invention having furyl acryl radicals, R — $\overset{\beta}{C}H = \overset{\alpha}{C}HCO$ —, (where R represents a furan ring,

and the radicals having substituted radicals in $\beta$ and $\alpha$ positions and in the furan ring are included) as photosensitive radicals has photosensitivity approx. 4000 times higher than that of cinnamate photosensitive resins, and still higher than that of highly sensitized cinnamate photosensitive resins.

The most sensitized cinnamate photosensitive resin presently know is polyvinyl cinnamate, synthetized by the alkali solution method, sensitized with N, N, N', N'-tetraethyl - 4,4'-diamino benzophenone, and its sensitivity is 3300.

The inventor studied various sensitizers to make furyl acrylate resins have higher sensitivity, and found that some aromatic nitro compound and aromatic ketones have storong sensitizing effect. When these compounds are added to photosensitive resins (around 10 wt. % for the resin), the sensitivity is much increased as 89100 when its is converted to the sensitivity based on that of cinnamate photosensitive resins.

Although the example described is only for polyvinyl furyl acrylate, it is easily assumed that the same effect can be expected by other polymers having the same photosensitive radicals because the photosensitive mechanism is the dimerization (or the polymerization more than dimerization) of furyl acryl radicals.

The development of such highly sensitive resin has been expected for the photosensitive resin used for the optical scribing machine and the plate engraving machine for making offset printing plates, and application to the sensitive material for enlargement is also expected.

| Photosensitive resin | Sensitivity |
|---|---|
| Polyvinyl cinnamate (sensitized with 5-nitro acenaphthene) | 1100 |
| Polyvinyl furyl acrylate | 4400 |
| Polyvinyl furyl acrylate (sensitized with N, N, N', N' - tetramethyl diamino benzophenone) | 89100 |

This invention will be fully understood by the following example.

Example

Furyl acrylic acid was synthetized by the method of Org. Synthesis Coll. Vol.3, 425 (1955). The furyl acrylic acid obtained was dissolved in toluene, and 1.5 eq. of thionyl chloride was added to the solution. The solution was heated and furyl acrylic chloride (b.p. 103°C at 3 mm Hg) was yielded by vacuum distillation.

In 100 cc of water, 1/10 mol (for OH radical) of polyvinyl alcohol was dissolved, and 100 cc of the 16% N$_a$OH aqueous solution and 100 cc of methyl ethyl ketone were mixed the above solution to make solution 1. In 124 cc of methyl ethyl ketone, 1.6 eq. (for OH radical) of furyl acrylic chloride was dissolved to make solution 2. Solution 1 was cooled to - 10°C, and solution 2 was added and the mixture was stirred for 90 minutes. After the reaction, the solution was separated into two layers when it was allowed to stand quiet. The upper layer was taken and put in a large quantity of water to form white precipitation. The precipitate was dried and dissolved in methyl cellosolve to make a 10 w/v solution, and 10 wt.% amount for the solid content of various sensitizers were added to the solution, and the sensitivity was determined by the grayscale method. Polyvinyl cinnamate sensitized with 5 - nitro acenaphthene was used as the standard. The results are shown in the table.

| Sensitizer (Aromatic nitro compound) | Sensitivity |
|---|---|
| 4 - nitro aniline | 9900 |
| 2 - nitro fluorene | 44550 |
| 5 - nitro acenaphthene | 29700 |
| 2.6 - dichloro - N, N - dimethyl - 4 - nitro aniline | 9900 |
| 2.6 - dibromo - N, N - dimethyl - 4 - nitro aniline | 14850 |
| 4 - nitro acetanilide | 14850 |
| N - acetyl - 4 - nitro - 1 - naphthyl amine (Aromatic amine) | 29700 |
| Iode eosine | 4950 |
| N, N, N', N' - tetramethyl - 4, 4' - diamino benzophenone | 89100 |
| N, N, N', N' - tetraethyl - 4, 4' - diamino benzophenone | 89100 |
| N, N - dimethyl - 4 - amino benzophenone | 44550 |
| Anthraquinone | 29700 |
| Methyl anthraquinone | 9900 |
| Ethyl anthraquinone | 44550 |
| Amyl anthraquinone | 44550 |
| Reference | |

The sensitivity of sensitized polyvinyl cinnamate, synthetized by the alkali solution method (Pat. No. 408669 and Pat. No. 463369), determined by the method in Example is as follows.

| Sensitizer | Sensitivity |
|---|---|
| 4 - nitro aniline | 410 |
| 5 - nitro acenaphthene | 1100 |
| 2.6 - dibromo - N, N - dimethyl - 4 - nitro aniline | 800 |
| N, N, N', N' - tetramethyl - 4, 4' - diamino benzophenone | 3200 |
| N, N, N', N' - tetraethyl - 4, 4' - diamino benzophenone | 3300 |

The specification of Japanese Pat. No. 9125/68 is as follows:

Publication number: 6819125

Title of the invention: Photosensitive composition and photosensitive element

This invention relates to novel hydrophilic photosensitive compositions which can be converted into insoluble rubberlike elastomers having three-dimensional structures by the action of actinic light. Furthermore, the present invention relates to a photosensitive element consisting mainly of said compositions. More particularly, the present invention relates to photosensitive compositions which are capable of photo-crosslinking reaction of unsaturated polyester and photosensitive element particularly useful for making a flexographic printing plate, consisting of a layer of said photosensitive composition and a support.

With the modernization of packaging the flexographic printing has recently moved into the limelight. The flexographic printing has many advantages that a printing material can be fastened with ease to a cylinder because of the flexibility of the printing material, a high speed running with low pressure can be effected by using a quick-drying ink(kissimpression) due to better transition of ink from a printing plate to materials to be printed, good press life is obtained and flexographic printing gives good results in printing on metal and plastic as well as paper. Accordingly, the flexographic printing is particularly suitable for printing on a metal foil such as aluminium, a plastic film such as polyethylene or polypropylene, cellulose, glassine paper, kraft paper, corrugated board and so on, and therefore it is apparent that the flexographic printing will become furthermore popular in the future.

In a process of making the flexographic printing plate, hitherto, a metal plate is initially prepared following the procedures of polishing (1), sensitizing solution coating and drying (2), exposure (3), development (4), renforcing of a sensitive coating film (5), pre-etching (6) and etching (7), and then a matrix is prepared by matrix molding (8) ( a thick paper immersed with a phenol resin being pressed on said metal plate, and being heated under pressure), and finally a rubber plate is obtained by vulcanization of raw rubber (9) ( non-vulcanized raw rubber being pressed on said matrix and being heated under pressure). These processes are very intricate and consequently, a lot of lavor and skill are required for the plate making and the material cost is great, so that it has been greatly required to improve the plate making process of flexography.

The present invention provides the plate making material which satisfies said requirements.

That is, an object of the present invention is to provide photosensitive compositions and photosensitive element which can be converted to a flexographic printing plate by simple procedures such as irradiation (hereinafter called exposure) of a photosensitive layer of photosensitive element consisting of a photosensitive composition layer (hereinafter called photosensitive layer) and a support with the actinic light through a negative or positive film having an image-bearing transparency and such as removal (hereinafter called development) of the unexposed portion of the photosensitive layer by a solution.

In order that such photosensitive compositins are useful for making the flexographic printing plate the composition after exposure must in the first place have a rubber elasticity and in the second place the unexposed portion must be readily devepoped with water or aqueous solution of acid, alkali or organic solvent-(hereinafter called aqueous solution). Further, in the third place the composition after exposure must not swell by the organic solvent contained in a large amount particularly in a quick-drying ink.

That is, if the composition after exposure does not have the rubber elasticity, it is wholly valuless for the flexographic plate making. Further, if the unexposed portion is insoluble in water or aqueous solution and must be developed by an organic solvent, it is disadvantageous from the viewpoint of economy and health of workers. Yet further, if the composition after exposure swel by an organic solent such as butyl acetate, methanol, or methylethylketone, printing can not be effected by using an ink containing such organic solvent.

Hitherto, it is known to cure the unsaturated polyester and the crosslinking agent by the actinic light in the presence of a photosensitizing agent (Industrial Engineering Chemistry, Vol. 31, No. 12, Page 1512, ibid. Vol. 47, No. 10, Page 2125, or U.S. Pat. No. 2673151). However, these known compositions do not have physical properties, e.g., solubility before exposure or rubber elasticity after exposure) as required for the flexographic plate making and consequently are not wholly valuable for practical use as the photosensitive compositions used for the flexographic printing plate making.

The present invention is wholly different from these compositions and is based on the discovery that the unsaturated polyester obtained by using an alcohol component monomer having at least 5 ether-bondings in the molecule as alcohol component of the unsaturated polyester shows an excellent rubber elasticity after photocrosslinking, and a good transition of ink and does not swell by various organic solvents and is very valuable as the ingredient of the photosensitive composition of the present invention since the said unsaturated polyester is very hydrophilic.

That is, the present invention relates to photosensitive compositions consisting of an unsaturated polyester, a crosslinking agent and photosensitizing agent in which said unsaturated polyester is obtained by polycondensation of an alcohol component monomer having at least 5 ether-bondings in the molecule and an acid component monomer.

Further, the present invention relates to a photosensitive element, which is particularly useful for making a flexographic printing plate, consisting of a layer of said photosensitive composition and a support.

Usually, an unsaturated polyester is formed through such a reaction as direct reaction, ester interchange alcoholysis or acidolysis) reaction, dehydrochloride reaction or addition reaction between a component which involves polyol and/or its lower fatty acid ester or polyepoxy compound and such additional amounts of compounds for modification as monohydric alcohol or its lower fatty acid ester (hereafter described as alcohol component) and a component which involves unsaturated polycarboxylic acid (including anhydride, lower alcohol ester and halogenide) and such additional amounts of compounds for modification as saturated polycarboxylic acid(including anhydride, lower alcohol ester and halogenide) and monocarboxylic acid (hereafter described as acid component).

In order that the rubber elasticity is retained after photocrosslinking of the unsaturated polyester at least 5 ether-bondings must be present in each one or whole part of structural units corresponding to alcohol component among the structural unit between the two adjacent ester bonding in the unsaturated polyester molecule. Hereafter one part of the structure of the unsatruated polyester molecule obtained by reaction between acid component and alcohol component containing fumalic acid and polyethyleneglycol as a major ingredient will be given for illustration.

$$\underset{(A)}{-OCOCH{=}CHCOO}\underset{(B)}{(CH_2Ch_2O)_n}\underset{(C)}{COCH{=}CH-}$$

In order that the unsaturated polyester shows the rubber elasticity after photo-crosslinking at least 5 otherbondings must be present between B and C (that is, in the structural unit corresponding to alcohol component) and accordingly *n* must be 6 or more in the above formula. It seems that such ether-bondings present in the unsaturated polyester molecule give a flexibility to the molecule together with the ester bondings and thereby giving the rubber elasticity. The alcohol component may have any number of ether-bondings which is 5 or more.

On the other hand, in order that the photosensitive composition containing the unsaturated polyester as constituting element has the practical value, the unsaturated polyester must be rendered hydrophilic. It has been found that such requirement is satisfied when each one or whole part of the monomer unit corresponding to the alcohol component of the unsaturated polyester has at least 4 ether-bondings. It seems that the oxygen atom contained in the ether-bonding given the hydrophilic property to the unsaturated polyester. Herein "hydrophilic property" means the capability of dissolving in water or aqueous solution.

Accordingly, above two conditions (hydrophilic property before exposure and rubber elasticity after exposure) can be satisfied by that each one or whole part of the monomer unit of alcohol component in the unsaturated polyester molecule has at least 5 etherbondings. Such unsaturated polyester can be obtained by conventional polycondensation of an alcohol component monomer having at least 5 ether-bondings and an acid component monomer.

As such alcohol component monomer, the following examples are cited:

Polyethyleneglycol of the formula $HO-(CH_2CH_2O)_n-H$ in which *n* is at least 6,Polypropyleneglycol of the formula

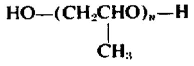

in which *n* is at least 6,

Polyoxypropylated glycerol of the formula

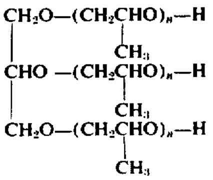

in which *n* is at least 2, Polyoxypropylated trimethylolpropane of the formula

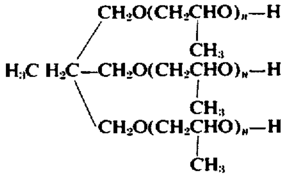

in which *n* is at least 2, Poly[3,3-bis(chloromethyl)oxacyclobutane] of the formula

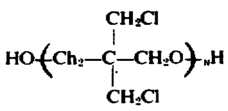

in which *n* is at least 6, Polytetrahydrofuran of the formula $HO(CH_2CH_2CH_2CH_2O)_nH$ in which *n* is at least 6, copoly(oxyethyleneoxypropylene)glycol in which the average molecular weight is at least 290, and lower fatty acid esters or glycidylether thereof. Two kinds or more of said alcohol may be used in a combined form. These alcohols are readily available as marketed product.

In order to improve mechanical strength or other physical and chemical properties(for example, solvent resistance) of the photosensitive composition after exposure, one part of alcohol component for raw material of unsaturated polyester is substituted by another alcohol component, having 1 to 4 ether-bondings or entirely none, and thereby the unsaturated polyester may be modified.

But, in order that the hydrophilic property before exposure and the rubber elasticity after exposure may not be impaired, the unsaturated polyester is preferably synthesized by using such an alcohol component in which at least one kind of polyol having at least 5 ether-bondings is contained at least 5+(5000/E) percent moles of total alcohol component, where E is the average molecular weight of the monomer having at least 5 ether-bondings. For example, if $i$ kinds of the said polyol are employed in molar amounts of $n_1, n_2 \ldots n_i$ respectively, the average molecular weight is given by the following formula $$E=\Sigma\ (MiNi/N)$$

in which $M_i$ is the molecular weight for the ith polyol having at least 5 ether-bondings in the molecules and $N=n_1+n_2+\ldots n_i$.

Consequently, when polyethylene glycol in a molecular weight of 1540 and propylene glycol are used as alcohol component monomers, it is preferably desired to use said polyethylene glycol as the alcohol. component in the amount of 5 +(15000/1540) molar percent at least, namely, 15 molar percent or more, based on total molar amount of said polyethylene glycol and propylene glycol.

A mixture consisting of 0.1 mole of polyoxypropylated glycerine (molecular weight 1500) and 0.9 mole of polyethylene glycol(molecular weight 1000) has an average molecular weight of 1050, so that for example, when ethylene glycol is used besides the said mixture, it is preferred that 19 molar percent or more of alcohol component monomer shall be a mixture of siad polyoxypropylated glycerine and polyethyleneglycol.

Alcohol components used for modification of the unsaturated polyester are as follows: ethyleneglycol, and/or polyethyleneglycol with the general formula of $HO-(CH_2CH_2O)_n-H$ wherein $n$ is 2 to 5, propyleneglycol and/or polypropyleneglycol with the general formula of $$HO(CH_2\underset{\displaystyle CH_3}{\underset{|}{C}}HO)_n-H$$

wherein $n$ is 2 to 5, polymethyleneglycol, tetramethyleneglycol, polyhydric alcohol such as glycerine, pentaerythritol and sorbitol, and/or those lower fatty acid esters, and/or glycidyl ether, ethyleneglycol diglycidyl ether, diethylene glycoldiglycidyl ether, polyepoxides such as 1,2,3,4-diepoxybutane, monohydric alcohol such as octyl alcohol, decyl alcohol and stearyl alcohol and/or monoepoxide such as ethylene oxide and propylene oxide.

Furthermore, alcohol components having an unsaturated group, such as butenediol, glycerine monoacrylate, glycerine monomethacrylate, glycerine monooleate, pentaerythritol diacrylate, pentaerythritol diacrylate, allylalcohol and metallylalcohol re useful for obtaining photocrosslinked products of unsaturated polyester having a high mechanical strength.

An unsaturated polyester is synthesized through the polycondensation reaction of the said alcohol component monomer and unsaturated carboxylic acid component monomer. Usually, maleic acid, maleic anhydride, dimethylmaleate, diethylmaleate, fumaric acid, dimethyl fumarate, diethylfumarate, chloromaleic acid, citraconic acid, citraconic anhydride, itaconic acid, muconic acid are used as the said unsaturated polycarboxylic acid used in the synthesis of unsaturated polyester.

To improve solvent resistence and abrasion resistance of elastomers formed through the photocrosslinking reaction, one part of the acid component of raw material of the unsaturated polyester is substituted by a polycarboxylic acid having no unsaturated groups, and thereby the unsaturated polyester can be modified. On this occasion, in order to obtain fully crosslinked products, it is preferred that the amount of unsaturated polycarboxylic acid be not less than 5 percent moles of the total amount of the acid component. If the amount of unsaturated polycarboxylic acid is less than 5 molar percent of the total amount of acid component, a photo-crosslinking reaction of unsaturated polyester is not caused beyond the condition of a soft-gel even if a crosslink is produced and thereby the practical usability will be nullified.

Acid components having no unsaturated groups, used for modifying the unsaturated polyester, are succinic acid, adinic acid, phthalic acid, isophthalic acid, terephthalic acid, and/or these dimethylester, diethylester, or acid chlorides and/or phthalic anhydride, benzoic acid, palmitic acid, stearic acid.

It has been found that the hardness of the elastomers obtained by cross-linking reaction of the unsaturated polyester can be varied by the double bond concentration defined by the following equation: $C=(\Sigma Ajnj)/W$ in which Aj is the number of unsaturated group contained in one molecule of the $j$th unsaturated component of the raw material acid component, $nj$ is the number of mole of said unsaturated acid and W is the total weight of raw material alcohol component and acid component of the unsaturated polyester.

That is, in order to obtain the elastomers having the Shore hardness(A) more than 70, the unsaturated polyester must have such raw material composition that 1/C(hereafter described as 1/C value) is about below 100, and in order to obtain the elastomers having the Shore hardness not more than 50 the unsaturated polyester must have such raw material composition that 1/C value is about more than 800. Accordingly, the unsaturated polyester synthesized from 1 mole of fumaric acid(M.W.: 116), 0.8 mole of polyethyleneglycol(M.W.: 300) and 0.2 mole of propyleneglycol(M.W.: 76) has the 1/C value of about 371, and the photosensitive composition containing this unsaturated polyester gives after exposure the elastomer having the Shore hardness(A) 75-80. Further, the unsaturated polyester synthesized from fumaric acid, 0.5 mole of terephthalic acid(M.W. 168), 0.9 mole of polyethyleneglycol(M.W. 1000) and 0.1 mole of grycerine(M.W. 176) has the I/C value of about 2119, and the photosensitive composition containing this unsaturated polyester gives the elastomer having the Shore hardness about 42–46 after exposure.

In order to accelerate the cross-linking reaction of unsaturated polyester and to increase the mechanical strength after cross-linking, there is used as cross-linking agent a vinyl monomer having at least one $CH_2$=C< group in the molecule, or example, styrene, chlorostyrene, vinyltoluene, diallylphthalate, diallylisophthalate, triallylcyanulate, N,N'-methylenebisacrylamide, and stearylacrylate. Most preferable are acrylamide, methacrylamide, N-hydroxyethylacrylamide, N-hydroxymethacrylamide, α-acetamidecrylamide, acrylic acid, methacrylic acid, α-chloroacrylic acid, p-carboxystyrene, 2,5-dihydroxystyrene, triethyleneglycoldiacrylate, triethyleneglycoldimethacrylate and like vinyl monomer.

It is preferable to use such cross-linking agent in amounts from 5–60% by weight of the total amount of said unsaturated polyester and cross-linking agent. When the amount of cross-linking agent is less than 5%(by weight), the velocity of the photo-crosslinking reaction is very retarded and the mechanical strength after photo-crosslinking is low and this is disadvantageous in practical use. When said amount is more than 60%(by weight), the elasticity after photo-crosslinking is impaired and this is undesirable.

We have ascertained that a photo-crosslinking reaction of the aforesaid unsaturated polyester and the aforesaid crosslinking agent can be promoted by using a photopolymerization initiator, namely a photosensitizer. Suitable photosensitizers for the present composition include benzoin, benzoin methyl ether, benzoin ethyl ether, , α-methyl benzoin, benzyl, diacetyl, diphenyl disulfide, eosine and thionine. These photosensitizers are used in the range of 0.001 to 10% by weight of the total amount of said unsaturated polyester and said crosslinking agent.

When the amount of photosensitizer is too small, the photo-crosslinking reaction is retarded and this is disadvantageous in practical use. On the other hand, when more than 10%(by weight) of photosensitizer is added, its photosensitization is not intensified for its amount, and the mechanical strength after photo-crosslinking is also reduced.

The photosensitizer compositions for the present invention can be obtained by mixing the said unsaturated polyester and the said crosslinking agent with the photosensitizer. The components are combined and heated in a range of 50° to 150°C and mixed in a mixer such as a roll; or, the components may be dissolved in a volatile solvent such as methanol, ethanol, ethyl ether or acetone, and then said solvent is evaporated.

The known inhibitors of polymerization can be used for the purpose of storing the photosensitive composition of the present invention with stability. The polymerization inhibitors may be added to the aforesaid composition when its components are mixed together; or it may be preliminarily added to each component, prior to mixing of those components.

The polymerization inhibitors used for the present invention are hydroquinone, mono-t-butylhydroquinone, catechol, p-t-butylcatechol, 2,5-di-t-butylhydroquinone, benzoquinone, 2,5-diphenyl-p-benzoquinone, picric acid and di-p-fluorophenylamine.

The polymerization inhibitor are added in an effective amount so that they do not restrain a photo-crosslinking reaction, though they are added for controlling a thermal reaction(dark reaction).

Consequently, the additional amount of polymerization inhibitor is in the range of 0.005 to 1.0% by weight of total amount of said unsaturated polyester and said crosslinking agent.

The photosensitive compositions for the present invention is acted on by light of a wave length between 2000 and 7000A, namely actinic light:thereby a photosensitizer is primary excited photochemically(a primary process of photochemistry), and a photo-crosslinking reaction in the unsaturated polyester is secondly caused(a secondary process of photochemistry) and then the said composition is converted into rubber-like elastomer.

On this occasion, when the wave length of light is less than 2000 A, the photon energy becomes excessively great and consequently all components of photosensitive composition are aliable to decompose and thereby the mechanical strength of the elastomers produced is deteriorated. On the other hand, when the wave length of light is more than 7000A, the photon energy becomes too small and thereby a photo-crosslinking reaction is not produced. Consequently, the light source of actinic light used for the photosensitive composition of the present invention is preferably a carbon arc lamp or a superhigh pressure mercury lamp or a high pressure mercury lamp or a low pressure mercury lamp.

The photosensitive composition of the present invention is exposed through a negative(or positive) film bearing transparent image and thereby an exposed area of said composition becomes an elastic material in from one to ten minutes. The non-image portion, namely the non-exposed portion, can be removed by water or aqueous solution, such as, for example, an aqueous solution of acetic acid, an aqueous solution of potassium hydroxide or sodium hydroxide, and an aqueous solution of methanol or ethanol. If desired, organic solvents such as methanol, ethanol, acetone, methylcellosolve, trichloroethylene, benzene and toluene may be used.

When the photosensitive composition of the present invention is utilized particularly for a flexographic printing plate, said photosensitive composition may be coated around a cylinder of printing machine and thereby a relief image having elasticity may be formed directly on said cylinder, but on this occasion, it is not always convenient to effect a coating operation of the photosensitive composition in the press room. In other words, in order that a photosensitive layer having a uniform thickness and a smooth surface may be formed on a cylinder, more time and lavor are still required, even if appropriate apparatus is provided. Consequently, the photosensitive composition of the present invention, can be more practically used in a convenient form of photosensitive elements, namely elements bearing a photosensitive layer consisting of said composition, wherein said composition is retained by a suitable support. Such a photosensitive element, after being exposed and developed, can be immediately adhered to a cylinder and then can be used as a printing plate.

As such support there may be used a sheet of rubber-like elastomer obtained by adding to a mixture of unsaturated polyester and a crosslinking agent a polymerization catalyst such as an organic peroxide (e.g., bezoyl peroxide, methylethylketoneperoxide) or azobisisobutyronitrile, and if desired adding further an accelerator such as dimethylaniline or cobalt naphthenate, and then heat-curing the resulting mixture.

But, from the view point of economy, sheets of styrene-butadiene rubber, acrylonitrile-butadiene rubber, polybutadiene rubber, ethylene-propylene rubber, polyurethane rubber, propylene oxide rubber or nitroso rubber; sheets of synthetic resin such as polyethylene, polypropylene, polystyrene, polymethylmethacrylate, polyvinyl chloride, polyvinylidene chloride, polyethylene teraphthalate polycarprolactam, phenol resin and urea resin; and celloid sheet are preferred.

Some flexographic printing machines are equipped with magnet inside of its cylinder. In this occasion, p printing plate can be with ease fastened to the cylinder by using said support which is compounded with powder of iron, cobalt or nickel or which is adhered to a plate or net of nickel, iron or cobalt. Besides the above, a metal plate of stainless, aluminium, zinc, copper or magnesium may be used as support. Particularly preferred is cloth. From the viewpoint of flexibility, strength and economy cloth woven from cotton, fibre, hemp fibre, polyamide fibre, polyvinyl acetate fibre and polyvinylidene chloride fibre is convenient for the use and production of photosensitive element. Support material is not limited, if the support has such strength as can support the relief image obtained by esposing and developing the photosensitive composition of the present invention and if the support can be with ease fastened to a cylinder.

A thickness of the support is in the range of 0.2 – 10 mm. If the support is too thin, it does not have enough strength to retain the photosensitive layer and if it is too thick, its weight is increased and it becomes inconvenient to handle.

The photosensitive composition of the present invention can be deposited, as a photosensitive layer, on a surface of the support by means of pressing, extrusion or calendering apparatus. In this case, fine grooves of straight or curved lines are preferably scratched on a surface of the support, or fine cavities or dents are preferably formed on it. The photosensitive layer is more securely retained owing to the aforesaid shape of the surface. The thickness of the photosensitive layer formed on the support can be changed optionally and usually, a photosensitive layer in 0.1 mm to 10 mm thickness is satisfactorily used as a layer of a photosensitive element for a flexographic printing plate. The photosensitive composition of the present invention has an excellent photosensitivity and can be converted to a elastomer in about 1 to 10 minutes after initiating the exposure. After the photosensitive layer of photosensitive element is exposed through a positive or negative film, the said photosensitive elements can be developed by water or aqueous solutions in about 2–15 minutes to give a printing plate. The printing plate, after being dried for 1–5 minutes at 50°–120°C, can be fitted immediately on a cylinder of a flexographic printing machine by means of adhesive tape, and a printing can be exercised by means of the flexographic printing ink.

The plate-making process in flexographic printing can be remarkably abbreviated as a consequence of adopting the photosensitive element of the present invention, and the making of flexographic printing plates can be practiced through a simple process without skill.

Furthermore, the elastomer obtained has shown excellent swelling resistance against organic solvents such as ethylacetate, butylacetate, methanol, ethanol, acetone, methyl-ethyl-ketone, methylcellosolve, benzene and toluene, and therefore a high speed rotary printing can be effected by using a quick drying ink, such as flexographic printing ink or photo-gravure ink. Moreover, a flexographic printing plate obtained from the photosensitive elements of the present invention, compared with a conventional rubber plate, gives better transition of ink to paper, polyethylene and foil of metal.

A flexographic printing plate obtained from the photosensitive elements of the present invention has a superior resistance against to printing abrasion and for example, in printing on kraft paper, flexographic printing was effected for 500,000 copies or more throughout one operation. The photosensitive compositions of the present invention have other uses besides flexographic printing, for example, sensitive material for name-plate making.

To explain the present invention more particularly, the following examples are given, but these are merely an exemplification and the present invention is not limited thereof.

EXAMPLE 1

(Synthesis of unsaturated polyester)

In an atmosphere of nitrogen gas, 0.4 mole of fumaric acid, 0.6 mole of phthalic anhydride, 0.7 mole of polyethylene glycol(average molecular weight 600) and 0.3 mole of propylene glycol were charged and allowed to be reacted at 180°–190°C during about 15 hours and thereby, unsaturated polyester(acid value 7) was obtained. About 100 mg of hydroquinone were added to the unsaturated polyester. (Preparation of photosensitive compositions)

To 70 g of unsaturated polyester obtained as above, 30 g of acrylic amide, 2 g of benzoin and about 30 mg of 2,5-diphenyl parabenzoquinone were added and these were thoroughly mixed by a roll heated at about 90°C and thereby a photosensitive composition was produced.

(Preparation of photosensitive elements)

The aforesaid photosensitive composition in a viscous state at 80°C was coated on the surface of a polybutadiene rubber sheet wherein fine grooves of about 25 lines per one cm width were formed on said surface, and a cleanly polished iron sheet was pressed on the coated surface to form a photosensitive layer about 1 mm in thickness having a smooth surface on the sheet. The photosensitive element was then cooled.

(Preparation of printing plate)

A negative film carrying a transparent image of letter was set on the photosensitive layer of the aforesaid photosensitive element and exposed to the light of a high pressure mercury lamp(270 w.) located about 30 cm from said film surface for 7 minutes. Said photosensitive element after being exposed was developed for about 5 minutes by water at 30°C and thereby an elastic relief image(Shore Hardness(A) was about 47) was obtained.

(Printing)

Kraft paper, corrugated board, cellophane and polyethylene film were printed by using the aforesaid printing plate and photo-gravure printing ink(as a solvent, butylacetate and xylole were included).

The results indicated a very favourable transition of ink. compared with a common rubber anastatic printing plate.

Example 2

Example 1 was repeated using the unsaturated polyester obtained in Example 1 except that the ratio of said unsaturated polyester to acrylamide was varied to 96/4, 90/10 50/50 and 40/40 to prepare a printing plate. The printing plate with the ratio of 96/4 gave a slight deformation on the part of the relief image when it was developed, and the one with the ratio of 40/60 indicated a slight swelling by alcoholic ink. The one with the ratio of 90/10 and the one with the ratio of 50/50 gave both excellent rubber elastic bodies, even if the former was pliable, and these indicated Shore Hardness(A) in the range of 43–47.

Examples 3–6

Example 1 was repeated except that 30 g of various crosslinking agent given in Table 1, 1.5 g of benzoin methyl ether and 20 mg of 2,5-diphenylparabenzoquinone were directly added to 70 g of the unsaturated polyester obtained in Example 1 and except that the mixture, after being well kneaded at about 60°C, was coated on an aluminium plate, to prepare a printing plate. There were obtained excellent printing plates of elastomers having the Shore Hardness(A) as shown in Table 1.

Table 1

| Number of Example | Crosslinking agent | Shore Hardness after exposure |
|---|---|---|
| 3 | Methacrylic acid | 45 |
| 4 | p-carboxystyrene | 47 |
| 5 | Triethyleneglycol dimethacrylate | 49 |
| 6 | Styrene | 47 |

Examples 7–14

Various unsaturated polyesters were synthesized in various compositions of raw material given in Table 2. Printing plates were prepared in the similar manner as in Example 1 using these unsaturated polyesters but using as support polyvinyl chloride resin plate of 1mm thickness. There were obtained printing plates of rubber elastic bodies having the Shore Hardness given in Table 2.

Table 2

| No. of Ex. | Composition of unsaturated polyester (mole) | l/c value | Acid value | Shore Hardness(A) after exposure |
|---|---|---|---|---|
| 7 | FA/PEG 300/PG (1/0.8/0.2) | 371 | 13 | 72 |
| 8 | FA/PEG 300/PPG400 (1/0.6/0.4) | 456 | 13 | 66 |
| 9 | FA/PEG1540/PPG1200 (1/0.4/0.6) | 1452 | 8 | 33 |
| 10 | FA/CA/PEG300/PPG400 /EG (0.7/0.3/0.4/0.3/0.3) 379 0.3) | 11 | 75 | |
| 11 | FA/IA/PEG600/PG/G (0.3/0.7/0.4/0.5/0.1) 0.1) | 413 | 12 | 69 |
| 12 | MAA/PAA/PEG300/TEG /P (0.5/0.5/0.5/0.4/0.1) 0.1) | 938 | 10 | 42 |
| 13 | FA/AA/PEG1000/MO (0.2/0.8/0.7/0.3) | 1849 | 9 | 30 |
| 14 | FA/AA/PEG4000/PG (0.5/0.5/0.3/0.7) | 2768 | 5 | 27 |

Note. - FA= fumaric acid, CA= citraconic acid, IA= itaconic acid, MAA= maleic anhydride, PAA= phthalic anhydride, AA= adipic acid, EG= ethyleneglycol, PG= propyleneglycol, TEG= triethyleneglycol, G= glycerine, P= pentaerythritol, GMO= glycerine monoeate, PEG300 – 4000= polyethyleneglycol with the molecular weights of 300 – 4000, PPG 400 and PPG 1200= Polypropyleneglycols with the molecular weights of 400 and 1200, respectively.

Example 15

0.1 mole of dimethyl maleate, 0.2 mole of dimethyl terephthalate, 0.26 mole of polyethylene glycol 1000(average molecular weight 1000) and 0.02 mole of glycerine polyoxypropyl ether triol(average molecular weight 1500) were charged under nitrogen gas and were allowed to react at a maximum temperature of 160°C for about 8 hours; and then 0.02 mole of allylalcohol was added and this mixture was reacted at 180°C or less for about 8 hours and an unsaturated polyester was obtained. In the same manner as in Example 1, but using the above unsaturated polyester, a printing plate was prepared. The obtained elastic relief of said printing plate indicated about 35 by Shore Hardness(A).

Example 16

0.1 mole of maleic anhydride, 0.2 mole of phthalic anhydride and 0.25 mole of polypropylene glycol(-molecular weight 1200) were charged under nitrogen gas and reacted at 180°C or less for about 12 hours; and 0.05 mole of polyethylene glycol diglycidyl ether(-molecular weight 400) was added and this mixture was allowed to react for 4 hours and then, an unsaturated polyester(acid value 8) was obtained. In the same manner as in Example 1, but using the above unsaturated polyester, a printing plate was prepared. The elastic relief of said printing plate indicated about 43 by Shore Hardness(A).

As the photopolymerization initiator for these liquid monomers, there can be used most known initiators.

Thus, examples of the preferred polymerizing initiators for the polyfunctional monomers described hereinbefore, include benzoin, benzoin methyl ether, benzoin ethyl ether, α-methylbenzoin, benzophenone and its derivatives. acetophenone, benzil and its derivatives, quinones such as anthraquinone and its derivatives or phenanthraquinone and its derivatives; crystal violet lactone and the like; wherein the derivatives are obtained by substituting the above compounds with an alkyl, such as methyl or ethyl, a halogen, a nitro or an amino group.

The filler which is applied to the polymerizable composition of the present invention is a finely divided powder having a particle size of 5 mμ to 50 μ. The filler is especially effective for stripping the cover film from the material when the particle size varies from 10 mμ to 10μ, for example, silicon oxide, titanium oxide, carbon black, zinc oxide and other commercially available pigments. The addition of these finely divided powder materials effects the preparation of a polymerizing layer having thixotropic properties.

The influence of the filler on the thixotropic property, i.e., the adhesion of the polymerizing composition to the cover films during the stripping process is due mainly upon the particle size thereof.

With respect to these problems, it may often be advantageous to add not only a single powder material but, instead, a mixture of two or more kinds of powders of different particle sizes. However, attempting to replace the finely divided powder material with higher molecular weight compound as the filler brings about bad results in the preparation of the pattern being suited closely to the original, due to a small difference in the sticking power between the polymerized portion and the unpolymerized portion.

In the present invention, therefore, the major components of the photopolymerizing composition are, as described hereinbefore, a liquid type monomer and a finely divided powder; but, if necessary, these ingredients may be mixed with a small amount of a polymer which is soluble in the monomer, as a viscosity regulator. Furthermore, various kinds of additives, to control the other properties of the composition, may often be mixed, dissolved or dispersed therein. For example, the polymerizing composition can be colored using a dyestuff or a pigment, whereby the irradiation and halation is more effectively controlled, and the printing stencil thus obtained is provided with a clear and fine image. In addition, an additional advantage is that the colored screen itself makes handling more convenient.

Concerning the materials which may be employed as the cover film, the various embodiments include plastic films, such as polyethylene, polyvinyl chloride, polypropylene, polyethylene terephthalate, cellophane, cellulose triacetate, polycarbonate, polyvinyl alcohol and the like; or materials (metal, paper and the like) laminated with said plastic films.

The following examples will serve to more specifically set forth the present invention without limiting the same.

Example 1

| | |
|---|---|
| Diethylene glycol dimethacrylate | 100 parts by weight |
| Benzoin methyl ether | 0.1 part by weight |
| Powdered zinc oxide (1 μ particle size) | 20 parts by weight |

The above composite mixture was sufficiently dispersed with stirring (about 15 minutes) to prepare a light-sensitive solution. A "Tenguchoshi" (thickness: 30 μ) was impregnated with the light-sensitive solution in a proportion of 10 g. per square meter.

Thereafter, the resulting paper was sandwiched between two sheets of polyvinyl chloride film (thickness: 30 μ), and pressed lightly over the film to completely remove air.

While still (i.e., in the absence of force applied thereto), the film and the Tenguchoshi paper adhere to each other depending on the viscosity of the light-sensitive solution.

In this case, the preferred quantity of the light-sensitive solution should be controlled to about 10 g/square meter and the thickness of the polymerizing layer to about 40 μ (including the Tenguchoshi paper).

The light-sensitive stencil printing material thus obtained was exposed through a positive film of a silver halide as an original for 4 minutes at a distance of 30 cm by a mercury lamp of 400 Watt power. After exposure, the upper vinyl chloride film and, successively, the lower film, were released to prepare a printing stencil corresponding to the original. The stencil could immediately be utilized in a mimeographic printing process. The printing process using the thus-produced stencil resulted in printed matter with very clear letter and linear images.

Furthermore, it was superior in printability, and was sufficiently usable for over 500 printings.

Example 2

| | |
|---|---|
| Pentaerythritol triacrylate | 100 parts by weight |
| Anthraquinone | 0.2 parts by weight |
| Carbon black (particle size: 70 mμ) | 10 parts by weight |

The above were mixed and vigorously stirred to disperse the ingredients by means of a rotary disperser (for about 20 minutes). A thin rice paper (thickness: 30 μ) was impregnated with the resulting dispersion in a proportion of 13 g. per square meter. Thereafter, the resultant paper was sandwiched between two pieces of cellophane (thickness: 20 μ) as a coating material, the air was removed therefrom and the polymerizing layer was thoroughly contacted wiht the cellophane by pressing to prepare a light-sensitive stencil printing material.

The light-sensitive material thus obtained was exposed through a document drawn on a tracing paper with black ink as an original for 3 minutes at a distance of 30 cm by means of a xenon lamp of 500 W power. Thereafter, the upper and the lower cover films of cellophane were released therefrom to prepare a printing stencil. The stencil was immediately employed in a printing process using a hand rotary printer. The stencil was superior in printability and was used to print over 700 copies.

EXAMPLE 3

Using the composition of Example 1, 0.2 part by weight of crystal violet was further added thereto, and a light-sensitive material was obtained in the same manner. The light-sensitive material thus obtained was exposed through an original for 6 minutes at a distance of 30 cm by means of a mercury lamp of 400 W power to prepare the objective printing stencil.

The stencil showed clear letters and a clear image due to the blue coloration and was very effectively and easily utilized in a printing process. With respect to the printability, there was no difference from that of Example 1.

Example 4

| | |
|---|---|
| Polyethylene glycol diacrylate (molecular weight: 400) | 100 parts by weight |
| Benzoin methyl ether | 0.3 part by weight |
| Silicon oxide (particle size: 10 $\mu$) | 15 parts by weight |
| Microrth Blue 4 G-A (pigment produced by Ciba, Ltd.) | 0.5 part by weight |

The above mixture was stirred to disperse the ingredients by means of a vertical type rotary disperser together with a steel ball. A nylon screen (270 mesh) was impregnated with the resulting dispersion, and sandwiched between the two pieces of cellophane, and thereafter a printing stencil was obtained in the same manner as in Example 1. The stencil was stronger than the one prepared using the paper as the intermediate backing of Example 1, and was so good that it rendered the printing image clear.

Generally, the ratio, by weight, of monomer, initiator and powder particles is respectively 100:0. 1–10:1–50.

What is claimed is:

1. A light-sensitive stencil printing material comprising a porous support having impregnated therein a thixotropic photopolymerizable composition containing a thixotropic photopolymerizable monomer, a photopolymerization initiator and finely divided solid particles having a particle diameter of from 5 millimicrons to 50 microns, and cover films provided on both sides of said support.

2. The stencil material as in claim 1, wherein said particles are silicone oxide, titanium oxide, carbon black or zinc oxide particles.

3. The stencil material as in claim 1, wherein said liquid monomer is a compound represented by the following formula,

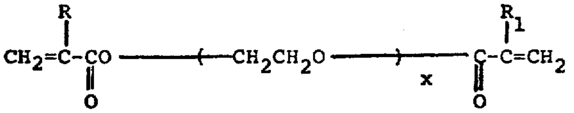

wherein $x$ is an integer greater than 2, and R and $R_1$ each is a hydrogen atom or a methyl group.

4. The stencil material as in claim 1, wherein said photopolymerization initiator is benzoin, benzoin methyl ether, benzoin ethyl ether, alphamethylbenzoin, benzophenone, acetophenone, benzil, anthraquinone, phenanthraquinone or crystal violet lactone.

5. The stencil material according to claim 1, wherein said liquid monomer is selected from the group consisting of a divinyl and polyvinyl compound.

6. The stencil material according to claim 1, wherein said liquid photopolymerizable monomer is selected from the group consisting of acrylic esters, methacrylic esters, acrylamides, methacrylamides, vinyl esters, styrenes, vinylpyrrolidone, vinylpyridine, acrylonitrile, methacrylonitrile, and vinyl imidazole.

7. The stencil material according to claim 1, wherein said monomer is selected from the group consisting of methyl, ethyl, butyl, hexyl, and octyl acrylic esters.

8. The stencil material according to claim 1, wherein said monomer is selected from the group consisting of methyl, ethyl, butyl, hexyl, and octyl methacrylic esters.

9. The stencil material according to claim 1, wherein said monomer is selected from the group consisting of N-methyl acrylamide, N-ethyl acrylamide, N,N-dimethyl acrylamide, N,N-diethyl acrylamide, and acryloyl morpholine derivatives of acrylamides and methacrylamides.

10. The stencil material according to claim 1, wherein said liquid monomer is selected from the group consisting of vinyl acetate, vinyl propionate, and vinyl butyrate.

11. The stencil material according to claim 1, wherein said liquid monomer is selected from the group consisting of styrene and $\alpha$-methyl styrene.

12. The light-sensitive stencil printing material according to claim 1, wherein said monomer is used in combination with a solid monomer.

13. The light-sensitive stencil printing material according to claim 1, wherein said liquid monomer is used in combination with a photocross-linkable polymer.

14. The light-sensitive stencil printing material according to claim 13, wherein said photocross-linkable polymer is selected from the group consisting of cinnamic acid light-sensitive resins, furylacrylic light-sensitive resins, and unsaturated polyester light-sensitive resins.

15. The light-sensitive stencil printing material according to claim 1, wherein said finely divided solid particles have a particle diameter of from 10 millimicrons to 10 microns.

16. The light-sensitive stencil printing material according to claim 1, wherein said cover films are selected from the group consisting of polyethylene, polyvinyl chloride, polypropylene, polyethylene terephthalate, cellophane, cellulose triacetate, polycarbonate, and polyvinyl alcohol.

17. The light-sensitive stencil printing material of claim 1, wherein said monomer is pentaerythritol triacrylate.

18. A light-sensitive stencil printing material comprising a porous support having impregnated therein a thixotropic photopolymerizable composition consisting essentially of a liquid photopolymerizable monomer, a photopolymerization initiator, and finely divided solid particles having a particle diameter of from 5 millimicrons to 50 microns, said liquid photopolymerizable monomer being a divinyl or polyvinyl compound selected from the group consisting of those compounds represented by the following formula:

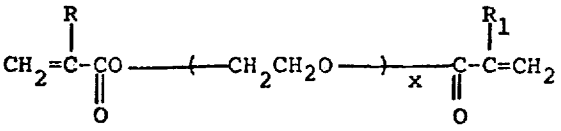

wherein $x$ is an integer of at least 2, wherein R and $R_1$, each represents a hydrogen atom or a methyl group, said divinyl or polyvinyl compound being employed alone or in conjunction with at least one monovinyl compound; and cover films provided on both sides of said support.

* * * * *